(12) United States Patent
Williams

(10) Patent No.: US 6,385,094 B1
(45) Date of Patent: May 7, 2002

(54) METHOD AND APPARATUS FOR ACHIEVING EFFICIENT MEMORY SUBSYSTEM WRITE-TO-READ TURNAROUND THROUGH READ POSTING

(75) Inventor: Michael W. Williams, Citrus Heights, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/677,140

(22) Filed: Sep. 29, 2000

(51) Int. Cl.[7] .................................................. G11C 7/00
(52) U.S. Cl. ........................... 365/189.01; 365/189.04; 365/239
(58) Field of Search ........................ 365/189.01, 189.05, 365/189.04, 230.08, 239, 233

(56) References Cited

U.S. PATENT DOCUMENTS

| | | | |
|---|---|---|---|
| 6,075,730 A | | 6/2000 | Barth et al. |
| 6,092,158 A | * | 7/2000 | Harriman et al. ............ 711/151 |
| 6,112,016 A | * | 8/2000 | MacWilliams et al. ..... 395/287 |
| 6,122,688 A | | 9/2000 | Barth et al. |
| 6,154,821 A | | 11/2000 | Barth et al. |
| 6,182,177 B1 | * | 1/2001 | Harriman ..................... 710/112 |
| 6,185,644 B1 | | 2/2001 | Farmwald et al. |

* cited by examiner

Primary Examiner—Huan Hoang
Assistant Examiner—Thong Le
(74) Attorney, Agent, or Firm—Pillsbury Winthrop LLP

(57) ABSTRACT

A method of operating a memory device includes determining whether a read command is to be issued after a write command. A posted read command is issued before issuance of the write command. The posted read command is issued in place of the read command to be issued after the write command. The write command is issued. Next, write data is transported onto a main bus in response to the write command. Data is read from the memory device, in response to the posted read command, prior to writing the write data to the memory device. The data is stored in a buffer. The write data is transported from the main bus to the memory device to write the write data to the memory device. Then, the data is outputted from the buffer onto the main bus.

15 Claims, 4 Drawing Sheets

METHOD AND APPARATUS FOR ACHIEVING EFFICIENT MEMORY SUBSYSTEM WRITE-TO-READ TURNAROUND THROUGH READ POSTING

BACKGROUND OF THE INVENTION

1. Field of the Invention

The present invention relates generally to a memory system, and more specifically, to a memory system having efficient write-to-read turnaround utilizing read posting.

2. Discussion of the Related Art

In a conventional memory device, such as a dynamic random access memory (DRAM), after a write (Wr) command is issued to the memory device, a certain amount of time lapses before the write data is transported onto the main bus (i.e., the central processing unit (CPU) bus) and written to the memory device. The column-strobe-address (CAS) read latency time, also known as "tCL", is the time period that lapses between the issuance of a read or write command and the output of data onto the main bus. After the write data is outputted onto the main bus, a certain amount of time is required for the write data to be transported from the main bus, to the input/output interface of the memory device, and written to the memory device. This time period is the write CAS recovery period, also known as "tWR". Generally, an action such as a read (Rd) command may not be performed by the memory device during the tWR period.

Because the tWR period may each be several clock periods long (each clock period being the time of a clock cycle), periods of inactivity during the tWR period do not allow the memory device to operate most efficiently. When taken in the aggregate, the tWR periods that occur for each write operation may add up to a significant amount of time where no read (Rd) command operations may be performed. When the memory device is unable to perform operations at certain times, the main bus becomes unsaturated, meaning that the main bus is not utilized most efficiently by not carrying as much data as it is able to handle. A memory device could operate more efficiently and quickly if the memory device could perform operations that can provide more data onto the main bus sooner.

DETAILED DESCRIPTION

Figure 1:
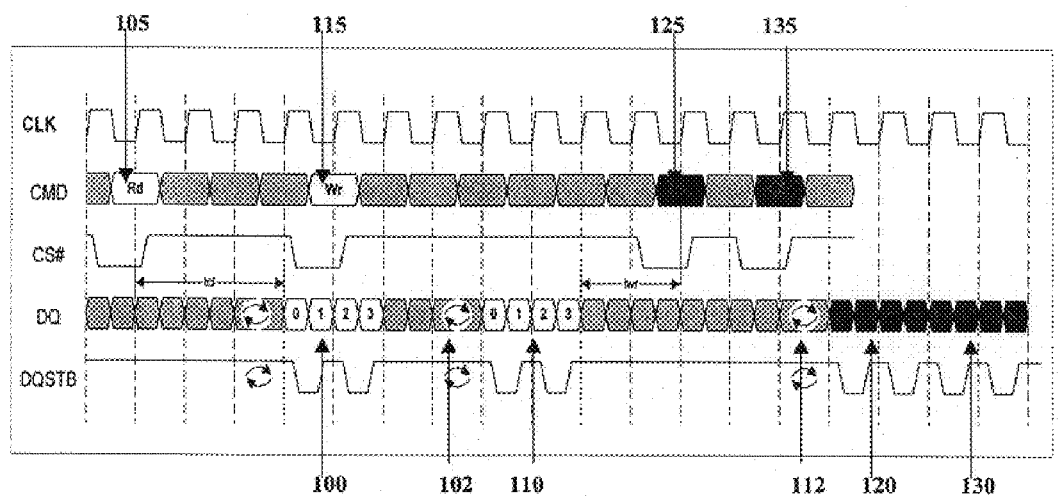
FIG. 1 illustrates a waveform timing diagram of read and write commands issued to a memory device according to the prior art.

FIG. 1 illustrates a waveform timing diagram of read and write commands issued to a memory device according to the prior art. Clock cycles (CLK) are represented at the top line of the waveform timing diagram in FIG. 1. The command line (CMD) illustrates when a read or write command is issued to the memory device. The data bus line (DQ) illustrates when the read data is read from the memory device and output onto the main bus, and when write data is output onto the main bus to be written to the memory device. The tCL time period illustrated in FIG. 1 is three clock periods. Therefore, three clock periods lapse between the issuance of a read or write command and the output of data onto the main bus corresponding to the read or write command. The tWR time period illustrated in FIG. 1 is two clock periods. That is, two clock periods are required to transport the write data from the main bus to the input/output interface of the memory device, and to write the write data to the memory device. The tCL and tWR periods are provided in FIG. 1 as examples, and the actual tCL time period and the tWR time period may differ from memory device to memory device, and these time periods may be longer or shorter than the examples illustrated in FIG. 1.

Referring to at the waveform timing diagram of FIG. 1, data 100 read from the memory device is output onto the main bus following the issuance of read (Rd) command 105, three clock periods later, as per the tCL time period. Write data 110 to be written to the memory device is output onto the main bus following the issuance of write (Wr) command 115. Before the write data 110 may be transported onto the main bus, the external interface bus connecting the memory device to a memory controller is switched from a data output mode to a write data receive mode. This switching operation 102 may consume one clock period, as illustrated in the example of FIG. 1.

After the write data 110 is output onto the main bus, a time period, tWR, is required for the write data 110 to be transported from the main bus to the input/output interface of the memory device, and written to the memory device. During the tWR period (which is two clock periods as shown in the example of FIG. 1), generally, an action such as a read (Rd) command operation may not be performed by the memory device. Therefore, the next command that may be issued is read (Rd) command 125, following the end of the tWR delay of two clock periods.

Before read data 120 may be transported onto the main bus in response to read (Rd) command 125, the external interface bus connecting the memory device to the memory controller is switched from a write data receive mode to that of a data output mode. This switching operation 112 may also consume one clock period, as illustrated in the example of FIG. 1. Thereafter, read data 120 is output onto the main bus. Subsequently, read data 130 is output onto the main bus in response to read (Rd) command 135. However, because of the tWR delay following the output of write data 110 onto the main bus, five clock periods lapse (including the one clock period to "turn around" the external interface bus), before any data is output onto the main bus.

Figure 2:
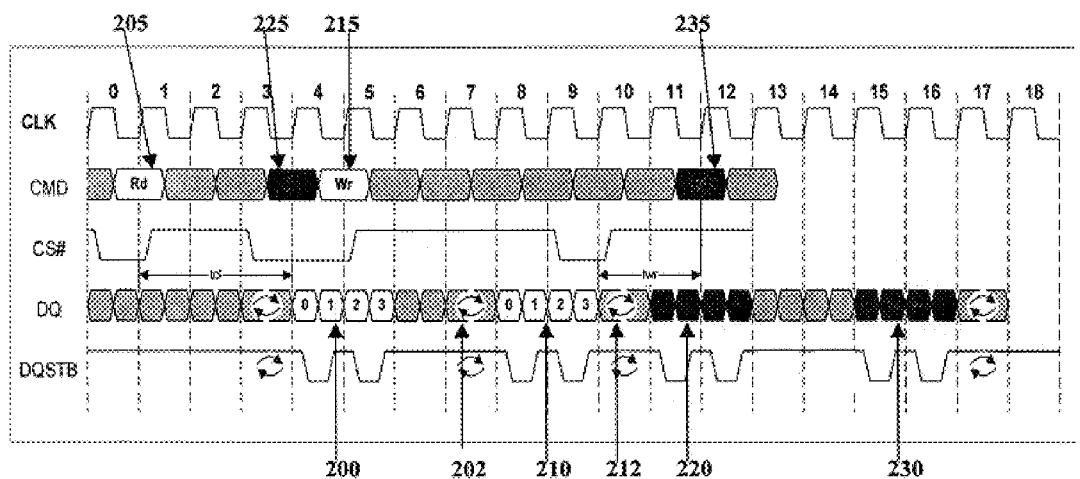
FIG. 2 illustrates a waveform timing diagram of read, write, and post read commands issued to a memory device according to an embodiment of the present invention.

FIG. 2 illustrates a waveform timing diagram of read, write, and post read commands issued to a memory device according to an embodiment of the present invention. As shown in FIG. 2, data 220 output onto the main bus may be achieved during the tWR period, and data 220 is output immediately following the "turn around" 212 of the external interface bus (utilizing one clock period), which is four clock periods earlier than data 120 as shown in FIG. 1. Data 220 is output onto the main bus in response to the read post (Rd post) command 225, issued prior to that of the write (Wr) command 215.

Read posting may be utilized when it is determined that a read (Rd) command will be followed by a write (Wr) command. A memory controller of a memory system has access to a limited range of future commands to be issued to the memory device. The memory controller may be configured to include logic to make the determination of when a read command will be followed by a write command. FIG. 2 illustrates an example of read posting based on the sequence of commands issued in FIG. 1. In FIG. 1, Rd command 105 is first issued, followed by Wr command 115, and followed by Rd command 125 and Rd command 135. Because in FIG. 1, a Rd command 125 follows a Wr command 115, read posting may be utilized.

Figure 3:
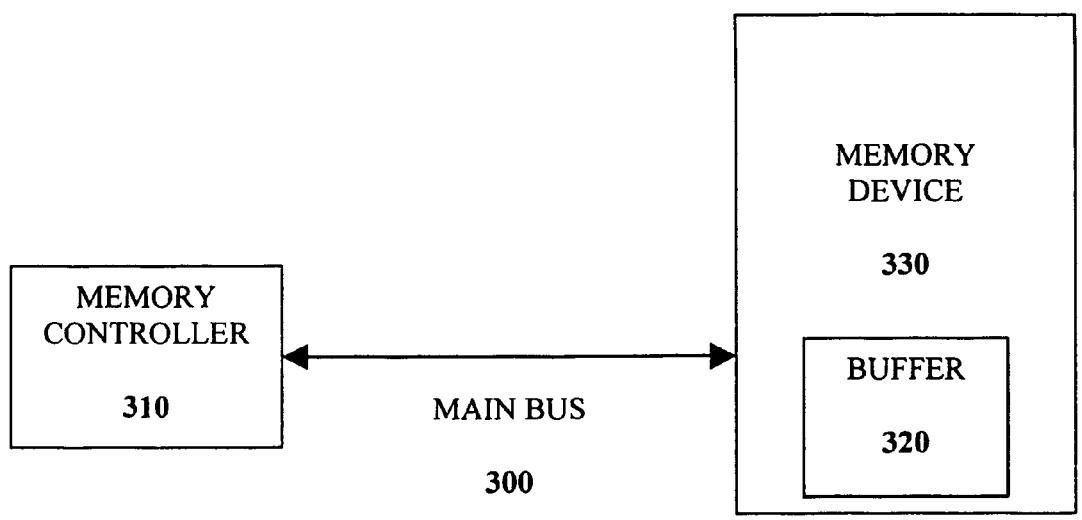
FIG. 3 illustrates a diagram of a memory system according to an embodiment of the present invention.

As shown in FIG. 2, read data 200 is output onto the main bus in response to read (Rd) command 205. However, when it is determined that a read command is to be issued following a write command, instead of issuing the read command following the issuance of the write command, as in the case of Rd command 125 issued following Wr command 115 in FIG. 1, a read post (Rd post) command 225 (also called a "posted read" command) may be issued out-of-order prior to Wr command 215. The Rd post command 225 instructs the memory controller 310 (see FIG. 3) to read the data corresponding to the read post command from the memory device 330 (such as a DRAM device), but to not immediately transport the data read from the memory device 330 onto the main bus 300. Rather, the data read from the memory device 330 in response to Rd post command 225 is stored in a buffer 320 (see FIG. 3), which resides in the memory device 330, and is delayed so as to be output following Wr command 215.

The buffer 320 temporarily stores read data 220 (initiated by Rd post command 225), while allowing write data 210 (output onto the main bus 300 in response to Wr command 215 following Rd post command 225) to be transported from the memory controller 310 to the main bus 300 and to the input/output interface of the memory device 330, and written to the memory device 330 prior to outputting read data 220 onto the main bus 300. In other words, the read post (Rd post) command 225 allows the memory device 330 to use the time for the write (Wr) command 215 decode and write data 210 transport to perform the read from the core of the memory device 330 and to store this data 220 in its read data output latch, i.e., the buffer 320. By utilizing buffer 320, the order of data output onto the main bus remains unchanged from that of FIG. 1, and the time lapsed before any data may be output onto the main bus following the output of write data onto the main bus 210 is minimized.

The subsequent read (Rd) command 235 may be issued following the tWR period (which is two clock periods, as in FIG. 1). Read data 230 is output onto the main bus following the three clock tCL period in response to Rd command 235. By utilizing the Rd post command 225, read data 220 and 230 output onto the main bus occurs two clock periods earlier than the conventional memory system shown in FIG. 1. That is, nine clock periods lapsed from when write data 110 is output onto the main bus to when read data 130 is output onto the main bus, while only seven clock periods lapsed from when write data 210 is output onto the main bus to when read data 230 is output onto the main bus. Most importantly, the data 220 for the second read (Rd) command 225 in FIG. 2 utilizing read posting (corresponding to Rd command 125 and data 120 in FIG. 1) is outputted onto the main bus four clock periods sooner than in the conventional protocol shown in FIG. 1. The waveform diagrams illustrated in FIGS. 1 and 2 are shown only as examples, and the clock periods "saved" may be greater than two clock periods.

Figure 4:
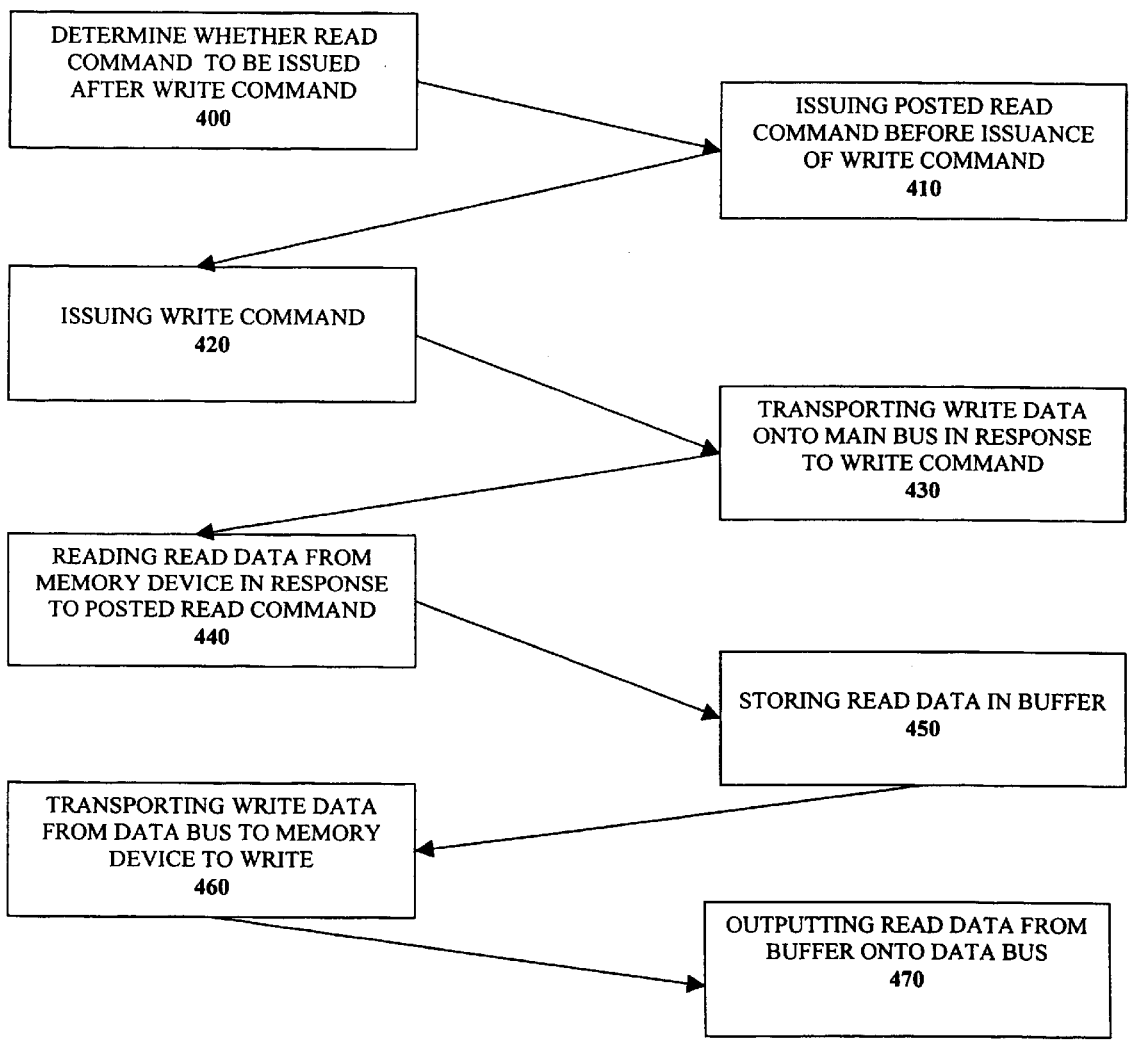
FIG. 4 illustrates a flow chart diagram of an operation of a memory system according to an embodiment of the present invention.

FIG. 4 illustrates a flow chart diagram of an operation of a memory system according to an embodiment of the present invention. First, the logic in the memory controller 310 determines 400 whether a read command is to be issued after a write command. If so, then a posted read command is issued 410 before the issuance of the write command. The posted read command is issued in place of the read command that was to be issued after the write command, as initially determined. After the posted read command is issued 410, the write command may be issued 420. Write data is transported 430 onto the main bus 300 in response to the write command being issued 420. Read data is read 440 from the memory device 330 in response to the posted read command, prior to writing the write data to the memory device 330. The read data is stored 450 in a buffer 320 of the memory device 330. The write data is transported 460 from the main bus to the memory device 330 to write the write data into the memory device 330. Once the write data has been transported 460 to the memory device 330, the read data may be output 470 from the buffer 320 and onto the main bus 300.

By utilizing read posting, not only can data be output onto the main bus following the output of write data onto the main bus earlier, but the memory device operates more efficiently by better saturating the main bus with data and wasting fewer clock periods than in the conventional non-read posting protocols. As the clock frequency increases, the read posting protocol has the potential to "recover" more clock periods over the current protocols, assuming that the write recovery time, tWR, remains constant. This assumption is valid because the write recovery time, tWR, is limited by the time it takes to store the data into the core capacitors making up a particular data location on the memory device, such as a DRAM. Even though DRAM cells are shrinking, i.e., they are being manufactured smaller and smaller, the sense amplifier circuit drivers charging the cells are shrinking as well, along with the length of the interconnects. Thus, the parasitic capacitance is relatively increasing. So, even though DRAM process technology continues to shrink the physical memory device, the absolute time of the tWR parameter remains fairly constant.

Read posting offers an advantage over other memory device posting schemes, such as write posting, in that due to the nature of the DRAM microarchitecture, read posting may be utilized for "free". In other words, there is no die overhead in implementing read posting on a DRAM device, and the existing resources of the DRAM device may be utilized to implement read posting.

While the description above refers to particular embodiments of the present invention, it will be understood that many modifications may be made without departing from the spirit thereof. The accompanying claims are intended to cover such modifications as would fall within the true scope and spirit of the present invention. The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A method of operating a memory device, comprising:
   determining whether a read command is to be issued consecutively after a write command;
   issuing a posted read command before issuance of the write command, wherein the posted read command is issued in place of the read command to be issued consecutively after the write command;
   issuing the write command;
   transporting write data onto a bus in response to the write command;

reading read data from the memory device, in response to the posted read command, prior to writing the write data to the memory device;

storing the read data in a buffer;

transporting the write data from the bus to the memory device to write the write data into the memory device; and outputting the read data corresponding to the posted read command from the buffer onto the bus following transport of the write data from the bus to the memory device.

2. The method according to claim 1, wherein the memory device is a dynamic random access memory (DRAM).

3. The method according to claim 1, wherein the read data read from the memory device by direction of the post read command is stored in the buffer until the write data is transported to the memory device.

4. The method according to claim 1, further including:

switching an interface bus connecting the memory device to a memory controller from a write data receive mode to a data output mode, wherein the interface bus is switched to the data output mode prior to outputting the read data from the buffer onto the bus.

5. The method according to claim 1, wherein the buffer resides within the memory device.

6. A memory controller to control a memory device, having instructions:

to determine whether a read command is to be issued consecutively after a write command;

to issue a posted read command before issuance of the write command, wherein the posted read command is issued in place of the read command to be issued consecutively after the write command;

to issue the write command;

to transport write data onto a bus in response to the write command;

to read read-data from the memory device, in response to the posted read command, prior to writing the write data to the memory device;

to store the read-data in a buffer;

to transport the write data from the bus to the memory device to write the write data into the memory device; and to output the read-data corresponding to the posted read command from the buffer onto the bus following transport of the write data from the bus to the memory device.

7. The memory controller according to claim 6, wherein the memory device is a dynamic random access memory (DRAM).

8. The memory controller according to claim 6, wherein the read-data read from the memory device by direction of the post read command is stored in the buffer until the write data is transported to the memory device.

9. The memory controller according to claim 6, further including instructions to switch an interface bus connecting the memory device to a memory controller from a write data receive mode to a data output mode, wherein the interface bus is switched to the data output mode prior to outputting the read-data from the buffer onto the bus.

10. The memory controller according to claim 6, wherein the buffer resides within the memory device.

11. A memory system, comprising:

memory device; and a memory controller coupled to the memory device, the memory controller having instructions to determine whether a read command is to be issued consecutively after a write command, to issue a posted read command before issuance of the write command, wherein the posted read command is issued in place of the read command to be issued consecutively after the write command, to issue the write command, to transport write data onto a bus in response to the write command, to read read-data from the memory device, in response to the posted read command, prior to writing the write data to the memory device, to store the read-data in a buffer, to transmit the write data from the bus to the memory device to write the write data into the memory device, and to output the read-data corresponding to the posted read command from the buffer onto the bus following transport of the write data from the bus to the memory device.

12. The memory system according to claim 11, wherein the memory device is a dynamic random access memory (DRAM).

13. The memory system according to claim 11, wherein the read-data read from the memory device by direction of the post read command is stored in the buffer until the write data is transported to the memory device.

14. The memory system according to claim 11, wherein the memory controller further includes instructions to switch an interface bus connecting the memory device to a memory controller from a write data receive mode to a data output mode, wherein the interface bus is switched to the data output mode prior to outputting the read-data from the buffer onto the bus.

15. The memory system according to claim 11, wherein the buffer resides within the memory device.

* * * * *